(12) United States Patent
Ichimaru

(10) Patent No.: US 6,734,738 B2
(45) Date of Patent: May 11, 2004

(54) LOW POWER TIMER CIRCUIT HAVING STABLE OUTPUT FREQUENCY

(75) Inventor: Kouzou Ichimaru, Higashikunisaki (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/105,210

(22) Filed: Mar. 25, 2002

(65) Prior Publication Data

US 2002/0167361 A1 Nov. 14, 2002

(30) Foreign Application Priority Data

Apr. 6, 2001 (JP) ........................................ 2001-107904

(51) Int. Cl.[7] .............................................. H03L 7/00
(52) U.S. Cl. .......................................... 331/14; 331/47
(58) Field of Search ............................ 331/2, 1 A, 10, 331/14, 25, 46, 47, 48, 51; 327/141, 291, 165, 166, 113–116, 117

(56) References Cited

U.S. PATENT DOCUMENTS

| | | | | |
|---|---|---|---|---|
| 4,537,515 A | * | 8/1985 | Dinger et al. ................ 368/202 |
| 5,180,992 A | * | 1/1993 | Akiyama et al. .............. 331/11 |
| 5,283,568 A | * | 2/1994 | Asai et al. .................. 340/7.33 |
| 5,398,007 A | * | 3/1995 | Yamazaki et al. ............. 331/46 |
| 5,845,204 A | * | 12/1998 | Chapman et al. ........... 455/343 |

* cited by examiner

Primary Examiner—Minh Nguyen
(74) Attorney, Agent, or Firm—William B. Kempler; W. James Brady, III; Frederick J. Telecky, Jr.

(57) ABSTRACT

A timer circuit having an oscillator circuit that has low power consumption and a stable frequency of the output signal. Timer circuit 10 has highly stable oscillator 21, counter 22 and frequency dividing value controller 24. Highly stable oscillator 21 generates a standard signal at a prescribed frequency. Counter 22 determines the frequency ratio of the frequency of the internal signal to the frequency of the standard signal, and, corresponding to the frequency ratio, frequency dividing value controller 24 changes the frequency dividing value of frequency divider 12. Because the difference between the frequency of the internal signal and the frequency of the standard signal can be known from the frequency ratio, it is possible to perform control such that the frequency of the output signal is kept stable at a prescribed frequency. In this case, as a constitution wherein the highly stable oscillator operates intermittently, even when highly stable oscillator with high power consumption is used, it is still possible to lower the power consumption of the highly stable oscillator and to decrease the overall power consumed by the entire timer circuit.

20 Claims, 1 Drawing Sheet

LOW POWER TIMER CIRCUIT HAVING STABLE OUTPUT FREQUENCY

FIELD OF THE INVENTION

This invention pertains to a type of timer circuit. More specifically, this invention pertains to a technology that provides a type of timer circuit with low power consumption and an output signal having a very stable frequency.

BACKGROUND OF THE INVENTION

In a silicon IC, etc., an on-chip timer circuit is provided.

FIG. 2 is a diagram illustrating timer circuit 101 as an example. This timer circuit 101 has crystal oscillator 111 and frequency divider 112. The signal generated by crystal oscillator 111 is subject to frequency division by frequency divider 112, and an output signal at a prescribed frequency is output to an external circuit not shown in the figure.

For said timer circuit 101, because crystal oscillator 111 with a stable oscillation frequency is used, frequency of the output signal is stable. However, crystal oscillator 111 has a high power consumption. Consequently, it is inappropriate for use in a timer circuit with a power consumption level of about 0.1 µW.

In order to solve this problem, it has been proposed that a ring oscillator of lower power consumption be used. For example, when a ring oscillator composed of a CMOS or other low-power elements is used as the oscillator, it is quite possible to form a timer circuit with a power consumption as low as about 0.1 µW.

However, although a ring oscillator has low power consumption, its oscillation frequency is unstable due to variation in temperature and variations in manufacturing processing. Consequently, it is hard for it to realize the function of a timer circuit.

An object of this invention is to solve the problems of conventional methods by providing a type of timer circuit which has low power consumption and high stability for the frequency of the output signal.

SUMMARY OF THE INVENTION

In accordance with one aspect of this invention a timer circuit has a first oscillator that outputs a first oscillation signal, a second oscillator that outputs a second oscillation signal at high precision, a frequency divider that performs frequency division for the first oscillation signal at a prescribed frequency dividing value and outputs an output signal at a prescribed frequency, a frequency dividing value setting circuit that sets the frequency dividing value of the frequency divider based on the first oscillation signal and the second oscillation signal, and a controller that controls the operation of the second oscillator and the frequency dividing value setting circuit such that the second oscillator and the frequency dividing value setting circuit work intermittently; in this timer circuit, under control of the controller, the second oscillator and the frequency dividing value setting circuit work intermittently, and the frequency of the output signal output from the frequency divider is controlled to be constant.

In accordance with an aspect of the invention, it is preferred that the frequency dividing value setting circuit have an arithmetic operation circuit that determines the frequency ratio of the first oscillation signal to the second oscillation signal, a memory circuit that stores a prescribed value, and a frequency dividing value controller that determines the frequency dividing value of the frequency divider corresponding to the frequency ratio and the prescribed value.

In addition, it is preferred that the first oscillator be a ring oscillator, and the second oscillator be a crystal oscillator.

Furthermore, it is preferred that the timer circuit have a battery for feeding electric power to the first oscillator, the second oscillator, the frequency divider, the frequency dividing value setting circuit, and the controller, and the first oscillator, the second oscillator, the frequency divider, the frequency dividing value setting circuit, the controller, and the battery be formed as a single body by molding.

According to a further aspect of this invention the timer circuit has a second oscillator as a highly stable oscillator, an arithmetic operation circuit, and a frequency dividing value controller. The highly stable oscillator generates a second oscillation signal as a standard signal. The arithmetic operation circuit determines the frequency ratio of the frequency of the first oscillation signal, which is an internal signal, and the frequency of the standard signal. The frequency dividing value controller changes the frequency dividing value of the frequency divider corresponding to the frequency ratio. For example, the frequency ratio in the state when the frequency of the output signal is in agreement with a prescribed target frequency is stored. By comparing the actually measured frequency ratio and the stored frequency ratio, it is possible to know the degree of difference between the frequency of the internal signal and the frequency of the standard signal. As a result, even when the frequency of the internal signal varies, by setting an appropriate frequency dividing value corresponding to the variation, it is possible to maintain the frequency of the output signal at a prescribed frequency with high stability without variation.

Also, in accordance with an aspect of this invention a controller (wake-up circuit) controls so that at least the highly stable oscillator works intermittently. Thus, even when the highly stable oscillator is a crystal oscillator or another device that has a high power consumption, because the operation time of the highly stable oscillator with respect to the entire operation time of the timer circuit is short, power consumption by the highly stable oscillator is lower than that if it worked all the time. As a result, the overall power consumption of the timer circuit can be lowered.

REFERENCE NUMERALS AND SYMBOLS AS SHOWN IN THE DRAWINGS

In the figures, 10 represents a timer circuit, 11 an oscillator, 12 a frequency divider, 13 a wake-up circuit, 21 a highly stable oscillator, 22 a counter (arithmetic operation circuit), and 24 a frequency dividing value controller.

Description of the Embodiment

In the following, an embodiment of this invention will be explained with reference to figures.

Figure 1:
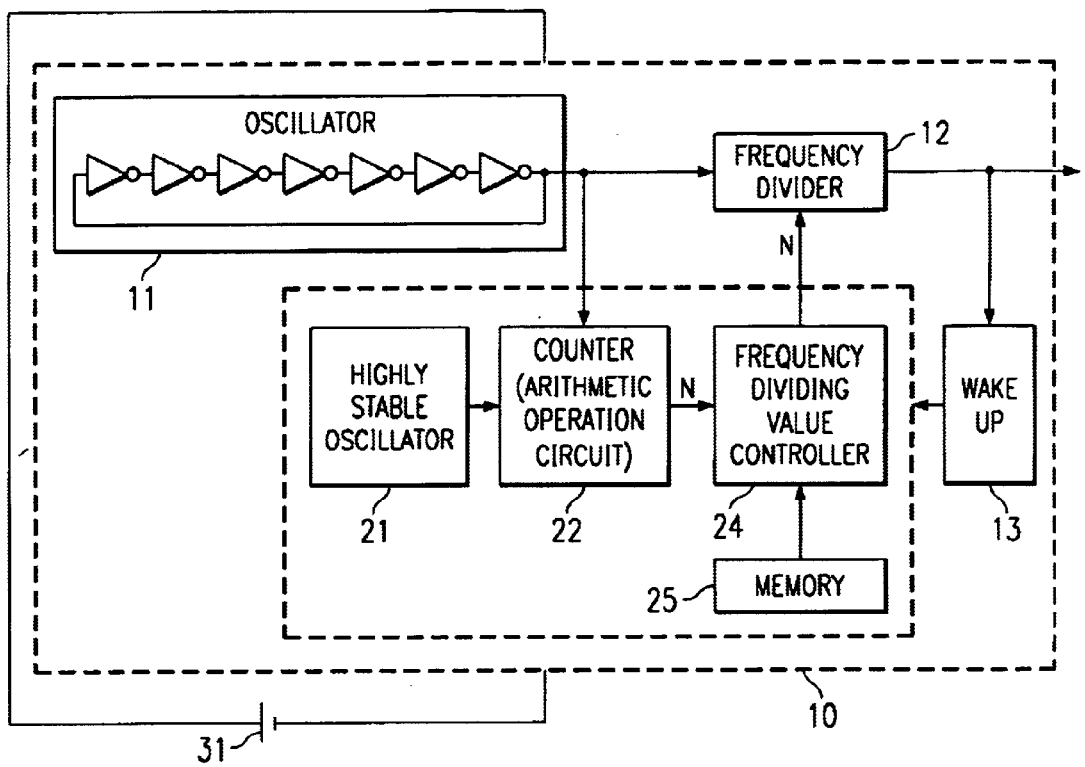
FIG. 1 is a block diagram illustrating the timer circuit in this invention.
Figure 2:
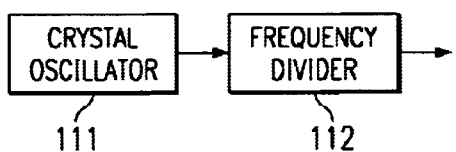
FIG. 2 is a block diagram illustrating a conventional timer circuit.

In FIG. 1, 10 represents the timer circuit in the embodiment of this invention.

This timer circuit 10 has oscillator 11, frequency divider 12, highly stable oscillator 21, counter 22, frequency dividing value controller 24, memory device 25, and wake-up circuit 13. This timer circuit 10 is driven by battery 31 as shown in FIG. 1.

Oscillator 11 is a ring oscillator prepared by connecting an odd number (7 in this example) of CMOS inverters in a ring configuration. A signal at a frequency corresponding to the operation time of each inverter is generated, and this signal is output as an internal signal to frequency divider 12 and counter 22.

Highly stable oscillator 21 is connected to counter 22. Said highly stable oscillator 21 is a crystal oscillator. It generates a standard signal with a highly stable frequency based on the internal signal and outputs it to counter 22.

Counter 22 is an example of the arithmetic operation circuit of this invention. It counts the number of pulses of the standard signal in each period of the internal signal, and outputs the ratio of frequency (hereinafter referred to as frequency ratio) n of the frequency of the internal signal to the frequency of the standard signal, that is, the count value, to frequency dividing value controller 24.

Memory device 25 is connected to frequency dividing value controller 24. Frequency dividing set value S to be explained later is pre-stored in memory device 25. Frequency dividing value controller 24 reads said frequency dividing set value S, multiplies said frequency dividing set value S by the reciprocal of frequency ratio n output from counter 22, and outputs the obtained value S/n as frequency dividing value N to frequency divider 12.

Frequency divider 12 performs frequency division for the internal signal with said frequency dividing value N, and outputs the obtained signal as an output signal to the external circuit.

In said timer circuit 10, if the frequency of the internal signal is f and the frequency of the standard signal is g, the frequency ratio n of the frequency of the internal signal to the frequency of the standard signal generated in counter 22 becomes $$n = g/f \qquad (1)$$

Also, frequency dividing value N generated by frequency dividing value controller 24 is $$N = S/n \qquad (2)$$

Said frequency ratio n and frequency dividing value N vary as a function of variation in frequency f of the internal signal. If the frequency of the output signal is F, one has F represented by $$F = f/N \qquad (3).$$

Consequently, based on said formulas (1), (2) and (3), frequency F of the output signal becomes $$\begin{aligned} F &= f/N \\ &= f \times n/S \\ &= f \times (g/f)/S \\ &= g/S \end{aligned} \qquad (4).$$

Frequency F of the output signal becomes a value independent of frequency f of the internal signal.

For said formula (4), the precondition is that said relationship represented by formulas (1) and (2) is established. Said relationship represented by formulas (1) and (2) is established only when highly stable oscillator 21, counter 22 and frequency dividing value controller 24 are operating.

Consequently, during operation of highly stable oscillator 21, counter 22 and frequency dividing value controller 24, frequency F of the output signal is independent of frequency f of the internal signal as indicated by said formula (4).

Although the frequency dividing value is determined by said formula (4), because frequency g of the standard signal is constant, when frequency F of the output signal is in agreement with prescribed frequency $F_0$, the frequency dividing value is determined uniquely. This frequency dividing value is taken as $S_0$. Said frequency dividing value $S_0$ is pre-stored in said memory device 25. As a result, the frequency of the output signal comes into agreement with prescribed frequency $F_0$ as the target frequency.

Consequently, it is possible to form a timer circuit with stable frequency of the output signal by using oscillator 11 with low oscillation stability.

In said timer circuit 10, in particular, highly stable oscillator 21 has high power consumption. Consequently, when highly stable oscillator 21 continuously works, the power consumption becomes high.

In consideration of this problem, wake-up circuit 13 is set in the timer circuit in this embodiment.

Wake-up circuit 13 works to stop power consumption of highly stable oscillator 21, counter 22 and frequency dividing value controller 24 for an extended time in every prescribed time interval. As a result, highly stable oscillator 21, counter 22 and frequency dividing value controller 22 work only for a short time in every prescribed time interval. In this example, highly stable oscillator 21, counter 22 and frequency dividing value controller 24 work only for a period of a few msec in every individual period of 10 min.

During the OFF period of highly stable oscillator 21, counter 22 and frequency dividing value controller 24, the internal signal output from oscillator 11 is subject to frequency division by frequency divider 12, and is output as an output signal. During this period, the frequency dividing value is fixed at the frequency dividing value that was set just before the end of operation of highly stable oscillator 21, counter 22 and frequency dividing value controller 24. However, said formula (4) is not established, and, when the frequency of the internal signal varies, the frequency of the output signal also varies corresponding to variation in the frequency of the internal signal.

However, when highly stable oscillator 21, counter 22 and frequency dividing value controller 24 re-start, for highly stable oscillator 21, counter 22 and frequency dividing value controller 24, the fixed frequency dividing value is changed such that target prescribed frequency $F_0$ is output. Consequently, frequency F of the output signal again comes into agreement with target frequency $F_0$.

In this way, in this embodiment, highly stable oscillator 21, counter 22 and frequency dividing value controller 24 operate only in every prescribed time interval. With each operation, an appropriate frequency dividing value is set, and frequency F of the output signal is put into agreement with target prescribed frequency $F_0$. Consequently, compared with the case when only an oscillator with low stability is used, frequency F of the output signal becomes stable.

The operation time of highly stable oscillator 21, counter 22 and frequency dividing value controller 24 is shorter than the total operation time of timer circuit 10. Consequently, the power consumption of highly stable oscillator 21, counter 22 and frequency dividing value controller 24 can be lowered significantly from the case when these circuits continuously work. Consequently, the overall power consumption of timer circuit 10 is also significantly reduced. As a matter of fact, the present inventors have manufactured a timer circuit with a power consumption of 0.1 μW and with an error of about 10%, that is, 0.2 Hz.

As explained above, timer circuit 10 in this embodiment has low power consumption. Consequently, even when it is carried in a device driven by a battery, operation can continue for a long time. According to the present inventors, it was found that when said timer circuit 10 is carried on a tire pressure sensor that uses a Li battery with a delivery capacity of 100 mAh and a guaranteed operation for 15 years, operation can be performed for a long time without any problems.

In the embodiment, a crystal oscillator is used as highly stable oscillator 21. However, this invention is not limited to this constitution. Any type of oscillator may be used as long as the oscillator has a stable oscillator frequency.

In the embodiment, a ring oscillator is used as an oscillator. However, it is also possible to use any oscillator as long as the power consumption is low.

Also, in the embodiment, the ratio (g/f) of frequency g of the standard frequency to frequency f of the internal signal is taken as frequency ratio n. However, frequency ratio n in this invention is not limited to this. One may also set ratio (f/g) of frequency f of the internal signal to frequency g of the standard signal as frequency ratio n'. In this case, said formula (2) becomes $$N = n' \times S \qquad (2)'$$

and frequency dividing value controller 24 has a constitution such that the product of frequency ratio n' and frequency dividing set value S becomes the frequency dividing value. Consequently, just as in the embodiment, it is possible for the frequency of the output signal to be independent of the frequency of the internal signal.

Also, in the embodiment, frequency dividing value controller 24 sets the frequency dividing value, and, according to this frequency dividing value, frequency divider 12 performs frequency division for the internal signal. However, one may also adopt a constitution in which frequency dividing value controller 24 generates an arithmetic operation value corresponding to the frequency ratio, and frequency divider 12 itself sets the frequency dividing ratio corresponding to the arithmetic operation value and performs frequency division for the internal signal.

It is possible to obtain a timer circuit that has a stable frequency of the output signal and a low power consumption.

What is claimed is:

1. A low power stable oscillator circuit comprising:
   a first oscillator that outputs a first oscillation signal,
   a second oscillator that outputs a second oscillation signal at a precise frequency,
   a frequency divider that performs frequency division for the first oscillation signal at a frequency dividing value and outputs an output signal at a prescribed frequency,
   a frequency dividing value setting circuit that sets the frequency dividing value of the frequency divider based on the first oscillation signal and the second oscillation signal,
   and a wake-up circuit that controls the operation of the second oscillator and the frequency dividing value setting circuit such that the second oscillator and the frequency dividing value setting circuit work intermittently;
   wherein the output frequency of the low power stable oscillator circuit is taken as the output of the frequency divider, the output frequency being set to a frequency of the second oscillator when the second oscillator and the frequency dividing value setting circuit are operative, and maintaining that frequency when the frequency dividing value setting circuit and the second oscillator are inoperative.

2. The low power stable oscillator circuit described in claim 1 wherein the frequency dividing value setting circuit has an arithmetic operation circuit that determines the frequency ratio of the first oscillation signal to the second oscillation signal, a memory circuit that stores a prescribed value, and a frequency dividing value controller that determines the frequency dividing value of the frequency divider corresponding to the frequency ratio and the prescribed value.

3. The low power stable oscillator circuit described in claim 2 wherein first oscillator is a ring oscillator.

4. The low power stable oscillator circuit described in claim 2 wherein second oscillator is a crystal oscillator.

5. The low power stable oscillator circuit described in claim 2 further comprising a battery for feeding electric power to the first oscillator, the second oscillator, the frequency divider, the frequency dividing value setting circuit, and the frequency dividing value controller, and the first oscillator, the second oscillator, the frequency divider, the frequency dividing value setting circuit, the wake-up circuit, and the battery are formed as a single body by molding.

6. The low power stable oscillator circuit described in claim 1 wherein first oscillator is a ring oscillator.

7. The low power stable oscillator circuit described in claim 6 wherein second oscillator is a crystal oscillator.

8. The low power stable oscillator circuit described in claim 6 further comprising a battery for feeding electric power to the first oscillator, the second oscillator, the frequency divider, the frequency dividing value setting circuit, and the frequency dividing value controller, and the first oscillator, the second oscillator, the frequency divider, the frequency dividing value setting circuit, the wake-up circuit, and the battery are formed as a single body by molding.

9. The low power stable oscillator circuit described in claim 1 wherein second oscillator is a crystal oscillator.

10. The low power stable oscillator circuit described in claim 9 further comprising a battery for feeding electric power to the first oscillator, the second oscillator, the frequency divider, the frequency dividing value setting circuit, and the freguency dividing value controller, and the first oscillator, the second oscillator, the frequency divider, the frequency dividing value setting circuit, the wake-up circuit, and the battery are formed as a single body by molding.

11. The low power stable oscillator circuit described in claim 1 further comprising a battery for feeding electric power to the first oscillator, the second oscillator, the frequency divider, the frequency dividing value setting circuit, and the frequency dividing value controller, and the first oscillator, the second oscillator, the frequency divider, the frequency dividing value setting circuit, the wake-up circuit, and the battery are formed as a single body by molding.

12. The low power stable oscillator circuit of claim 1 wherein the frequency F of output signal of oscillator circuit is defined as $$F = g/S$$

where
   g = frequency of the second oscillator
   S = frequency dividing set value
   wherein F is dependent on the frequency of the second oscillator g and independent of the frequency of the first oscillator both when the second oscillator is operative and when it is inoperative.

13. The low power stable oscillator circuit of claim 1 wherein a frequency dividing value is defined as $$N=n'\times S$$

where n'=f/g
f=frequency of the first oscillator
g=frequency of the second oscillator
S=frequency dividing set value.

14. In a timer circuit, a low power stable oscillator circuit comprising:

a first oscillator that outputs a first oscillation signal, a second oscillator that outputs a second oscillation signal at a precise frequency, a frequency divider that performs frequency division for the first oscillation signal at a frequency dividing value and outputs an output signal at a prescribed frequency, a frequency dividing value setting circuit that sets the frequency dividing value of the frequency divider based on the first oscillation signal and the second oscillation signal, and a wake-up circuit that controls the operation of the second oscillator and the frequency dividing value setting circuit such that the second oscillator and the frequency dividing value setting circuit work intermittently;

wherein the output frequency of the timer circuit is taken as the output of the frequency divider, the output frequency being set to a frequency of the second oscillator when the second oscillator and the frequency dividing value setting circuit are operative, and maintaining that frequency when the frequency dividing value setting circuit and the second oscillator are inoperative.

15. The timer circuit described in claim 14 wherein the frequency dividing value setting circuit has an arithmetic operation circuit that determines the frequency ratio of the first oscillation signal to the second oscillation signal, a memory circuit that stores a prescribed value, and a frequency dividing value controller that determines the frequency dividing value of the frequency divider corresponding to the frequency ratio and the prescribed value.

16. The timer circuit described in claim 14 wherein first oscillator is a ring oscillator.

17. The timer circuit described in claim 14 wherein second oscillator is a crystal oscillator.

18. The timer circuit described in claim 14 further comprising a battery for feeding electric power to the first oscillator, the second oscillator, the frequency divider, the frequency dividing value setting circuit, and the frequency dividing value controller, and the first oscillator, the second oscillator, the frequency divider, the frequency dividing value setting circuit, the wake-up circuit, and the battery are formed as a single body by molding.

19. The timer circuit of claim 14 wherein the frequency F of the output signal of the oscillator circuit is defined as $$F = \frac{g}{S}$$

where
g=frequency of the second oscillator
S=frequency dividing set value

Wherein F is dependent on the frequency of the second oscillator g and independent of the frequency of the first oscillator both when the second oscillator is operative and when it is inoperative.

20. The timer circuit of claim 14 wherein a frequency dividing value N is defined as $$N=n'\times S$$

where $$n' = \frac{f}{g}$$

f=frequency of the first oscillator
g=frequency of the second oscillator
S=frequency dividing set value.

* * * * *